(12) United States Patent
Gruening et al.

(10) Patent No.: US 6,190,971 B1
(45) Date of Patent: Feb. 20, 2001

(54) FORMATION OF 5F2 CELL WITH PARTIALLY VERTICAL TRANSISTOR AND GATE CONDUCTOR ALIGNED BURIED STRAP WITH RAISED SHALLOW TRENCH ISOLATION REGION

(75) Inventors: Ulrike Gruening, Wappingers Falls; Carl J. Radens, LaGrangeville, both of NY (US)

(73) Assignees: International Business Machines Corporation, Armonk, NY (US); Infineon Technologies North America Corp., San Jose, CA (US)

(*) Notice: Under 35 U.S.C. 154(b), the term of this patent shall be extended for 0 days.

(21) Appl. No.: 09/311,471

(22) Filed: May 13, 1999

(51) Int. Cl.[7] .................... H01L 21/336; H01L 21/8242; H01L 21/20
(52) U.S. Cl. .................... 438/270; 438/589; 438/243; 438/244; 438/246; 438/247; 438/248; 438/386; 438/387; 438/389; 438/390; 438/391
(58) Field of Search ........................................ 438/243, 386, 438/244, 246, 247, 248, 387, 389, 390, 391, 589, 270

(56) References Cited

U.S. PATENT DOCUMENTS

| | | | |
|---|---|---|---|
| 4,881,105 | 11/1989 | Davari et al. | 257/334 |
| 5,064,777 | 11/1991 | Dhong et al. | 438/242 |
| 5,156,992 | * 10/1992 | Teng et al. | 438/246 |
| 5,185,294 | 2/1993 | Lam et al. | 438/515 |
| 5,187,550 | 2/1993 | Yanagisawa | 257/307 |
| 5,214,603 | 5/1993 | Dhong et al. | 365/207 |
| 5,348,905 | * 9/1994 | Kenney | 438/396 |
| 5,362,663 | 11/1994 | Bronner et al. | 438/241 |
| 5,369,049 | 11/1994 | Acocella et al. | 438/243 |
| 5,571,743 | * 11/1996 | Henkels et al. | 438/396 |
| 5,672,537 | 9/1997 | Carl et al. | 438/386 |
| 5,692,281 | 12/1997 | Rajeevakumar | 29/25.42 |
| 5,770,876 | * 6/1998 | Lam et al. | 257/301 |
| 6,074,909 | * 6/2000 | Gruening | 438/242 |
| 6,093,614 | * 6/2000 | Gruening et al. | 438/388 |

* cited by examiner

Primary Examiner—John F. Niebling
Assistant Examiner—Jennifer M. Kennedy
(74) Attorney, Agent, or Firm—McGinn & Gibb, PLLC; Eric W. Petraske, Esq.

(57) ABSTRACT

A method and structure for manufacturing an integrated circuit device includes forming a storage device in a substrate, lithographically forming a gate opening in the substrate over the storage device, forming first spacers in the gate opening, forming a strap opening in the substrate using the first spacers to align the strap opening, forming second spacers in the strap opening, forming an isolation opening in the substrate using the second spacers to align the isolation opening, filling the isolation opening with an isolation material, removing the first spacers and a portion of the second spacers to form a step in the gate opening, (wherein the second spacers comprise at least one conductive strap electrically connected to the storage device) forming a first diffusion region in the substrate adjacent the conductive strap, forming a gate insulator layer over the substrate and the step, forming a gate conductor over a portion of the gate insulator layer above the step, forming a second diffusion region in the substrate adjacent the gate conductor and forming a contact over the diffusion region and isolated from the gate conductor, wherein a voltage in the gate conductor forms a conductive region in the substrate adjacent the step and the conductive region electrically connects the strap and the contact.

14 Claims, 7 Drawing Sheets

FORMATION OF 5F2 CELL WITH PARTIALLY VERTICAL TRANSISTOR AND GATE CONDUCTOR ALIGNED BURIED STRAP WITH RAISED SHALLOW TRENCH ISOLATION REGION

BACKGROUND OF THE INVENTION

1. Field of the Invention

The present invention generally relates to integrated circuits and more particularly to transistors having straps connecting transistor devices to storage devices.

2. Description of the Related Art

Vertical transistors are known in the art of semiconductor manufacturing for reducing the overall size of the transistor device and, therefore, for allowing an increase in the scaling of such devices. However, conventional vertical transistors have substantial problems associated with the formation of the strap (e.g., the conductive connection between the storage device and the gate/drain of the transistor).

The invention overcomes these problems by forming a self-aligned buried strap within a partially vertical transistor, as specified below.

SUMMARY OF THE INVENTION

It is, therefore, an object of the present invention to provide a structure and method for manufacturing an integrated circuit device including forming a storage device in a substrate, lithographically forming a gate opening in the substrate over the storage device, forming first spacers in the gate opening, forming a strap opening in the substrate using the first spacers to align the strap opening, forming second spacers in the strap opening, forming an isolation opening in the substrate using the second spacers to align the isolation opening, filling the isolation opening with an isolation material, removing the first spacers and a portion of the second spacers to form a step in the gate opening (wherein the second spacers comprise at least one conductive strap electrically connected to the storage device) forming a first diffusion region in the substrate adjacent the conductive strap, forming a gate insulator layer over the substrate and the step, forming a gate conductor over a portion of the gate insulator layer above the step, forming a second diffusion region in the substrate adjacent the gate conductor and forming a contact over the diffusion region and isolated from the gate conductor, wherein a voltage in the gate conductor forms a conductive region in the substrate adjacent the step and the conductive region electrically connects the strap and the contact.

Further, the forming of the isolation opening in the substrate and the filling of the isolation opening with an isolation material includes forming a first portion of an active area isolation region. The method also includes forming active area stripes to form a second portion of the active area isolation region.

The forming of the storage device includes forming a deep trench capacitor and the strap bisects a plane of the deep trench capacitor. Further, the gate opening is wider than the strap opening and the strap opening is wider than the isolation opening. The integrated circuit device is a partially vertical transistor and the strap also is a source region and the contact is a drain region.

The invention also comprises a method of manufacturing an integrated circuit chip that includes forming an opening having at least one step in a substrate, forming a first conductor in the opening below the step, forming a first diffusion region in the substrate adjacent the first conductor, forming a gate conductor over the step, forming a second conductor over the substrate adjacent the gate conductor and forming a second diffusion region in the substrate adjacent the second conductor. The forming of the opening further includes lithographically forming a gate opening in the substrate, forming first spacers in the gate opening, forming a strap opening in the substrate using the first spacers to align the strap opening, forming second spacers in the strap opening and forming an isolation opening in the substrate using the second spacers to align the isolation opening. The isolation opening is filled with an isolation material and the forming of the isolation opening in the substrate and the filling of the isolation opening with an isolation material includes forming a first portion of an active area isolation region, the method further includes forming active area stripes to form a second portion of the active area isolation region. The first spacers and a portion of the second spacers are removed to form the step in the opening and the second spacers are the first conductor. Further, the gate opening is wider than the strap opening and the strap opening is wider than the isolation opening. A voltage in the gate conductor forms a conductive region in the substrate adjacent the step and the conductive region electrically connects the first conductor and the second conductor. The opening is formed over a deep trench capacitor and the first conductor bisects a plane of the deep trench capacitor. The integrated circuit device is a partially vertical transistor and the first conductor is a source region and the second conductor is a drain region.

An integrated circuit chip according to the invention includes a substrate, an opening in the substrate, the opening having at least one step, a first conductor in the opening below the step, a first diffusion region in the substrate adjacent the first conductor, a gate conductor over the step, a second conductor over the substrate adjacent the gate conductor and a second diffusion region in the substrate adjacent the second conductor.

The integrated circuit chip opening includes a lithographically formed gate opening, a strap opening aligned with the gate opening using first spacers and an isolation opening aligned with the strap opening using second spacers. The integrated circuit chip also includes an isolation material filling the isolation opening and the isolation material includes a first portion of an active area isolation region and the integrated circuit chip further includes active area stripes forming a second portion of the active area isolation region.

The first spacers and a portion of the second spacers are removed to form the step in the opening and the second spacers include the first conductor. The gate opening is wider than the strap opening and the strap opening is wider than the isolation opening. A voltage in the gate conductor forms a conductive region in the substrate adjacent the step and the conductive region electrically connects the first conductor and the second conductor. The opening is formed over a deep trench capacitor and the first conductor bisects a plane of the deep trench capacitor. The first conductor includes a source region and the second conductor includes a drain region and the integrated circuit chip includes a partially vertical transistor.

By reducing the amount of lithographic processing, the invention avoids problems commonly associated with lithographic processes, including size reduction problems and alignment inaccuracies. Further, with the invention by forming the step in such a self-aligned manner, the spacing between the diffusion regions and the vertical transistor portion is very precise. This allows the device to be made smaller (which makes the device less expensive and faster), reduces the number of defects which results in an overall superior product when compared to conventional structures.

In addition, the invention forms the straps to bisect a plane of the storage devices which allows a more reliable connections between the storage device and the strap.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
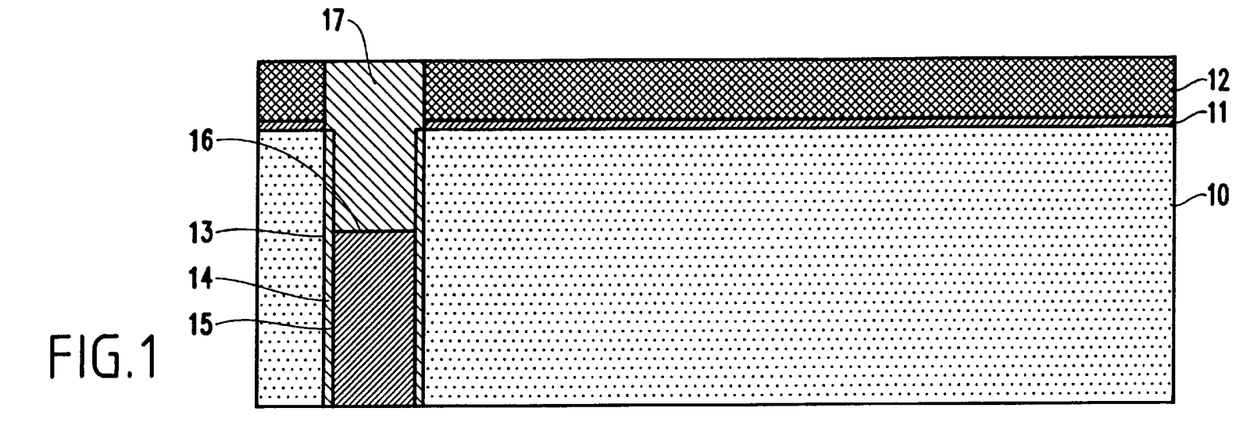
FIG. 1 is a schematic diagram of a partially completed vertical transistor according to the invention.

Referring now to the drawings, and more particularly to FIG. 1, a partially formed transistor according to a first embodiment of the invention is illustrated. More specifically, FIG. 1 illustrates a silicon substrate 10 upon which a first insulator 11 (such as a pad oxide) and a second insulator 12 (such as a pad silicon nitride) are formed.

Using processes well known to those ordinarily skilled in the art, a trench 13 is formed in the substrate 10. Such conventional processes could include photolithographic masking and conventional etching techniques. The upper portion (e.g., top 1.5 $\mu$m) of the trench, 13 is then lined with a thin (e.g., 30 nm thick) insulating collar 14 (such as a collar oxide). The insulating collar 14 is then recessed within the trench to a point just below the first insulator layer 11. A conductive material 16 (such as polysilicon, metal or alloy) is then deposited in the trench 13 and the structure is planarized using, for example, chemical mechanical polishing or other similar well-known techniques. The conductive material 16 is then recessed to a point below the insulator layer 11 (e.g.,200–600 nm into the trench 13). Finally, an additional insulator 17 (such as an oxide or nitride) is formed within the trench 14 and the structure is again planarized.

Figure 2:
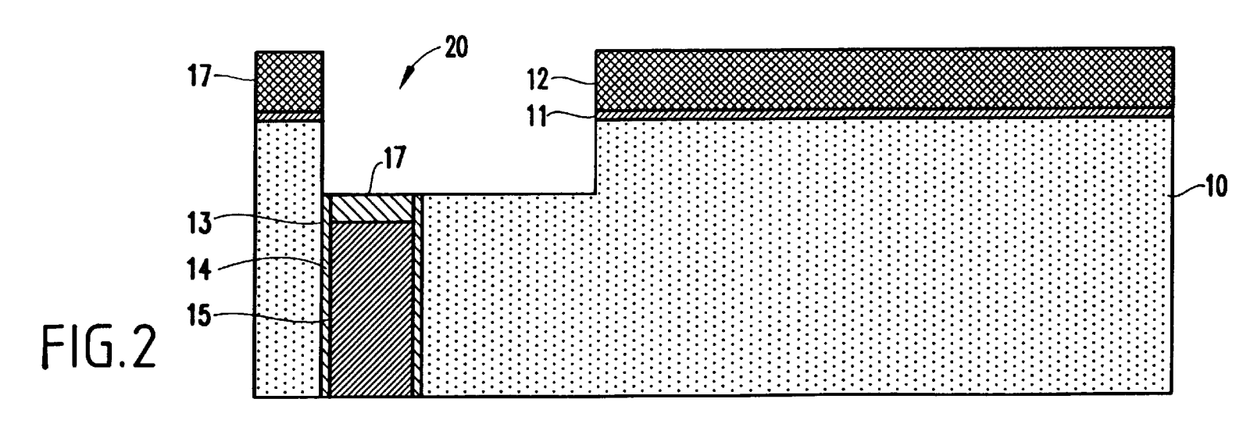
FIG. 2 is a schematic diagram of a partially completed vertical transistor according to the invention.

As shown in FIG. 2, an opening 20 (e.g., gate opening) is formed using conventional techniques, such as lithographic masking and etching. The gate opening 20 is formed above the trench 13 and down into the substrate 10 to a point to allow a portion of the insulator 17 to remain.

Figure 3:
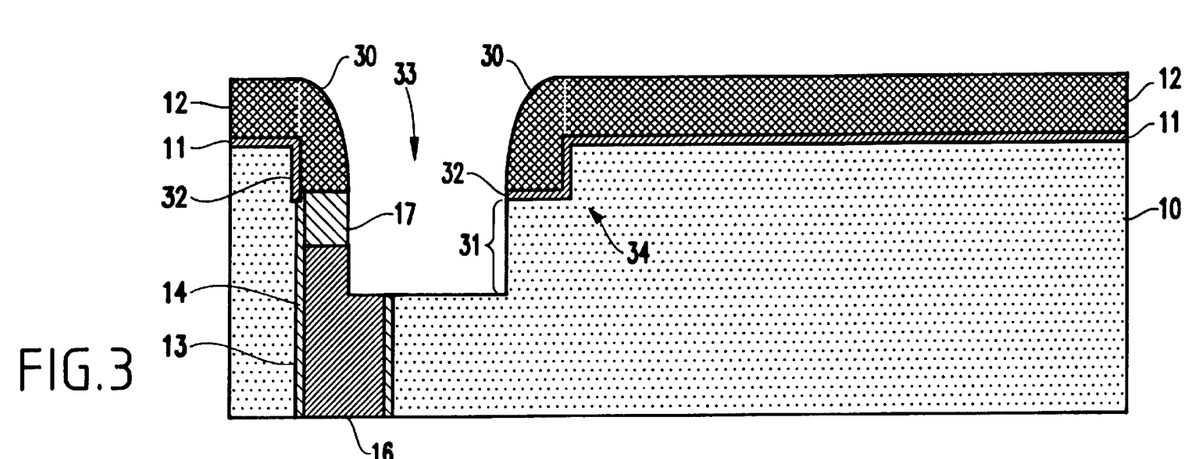
FIG. 3 is a schematic diagram of a partially completed vertical transistor according to the invention.

Next, as shown in FIG. 3, an additional insulator 32 is formed (e.g., grown) on the exposed portions of the substrate 10 to continue the insulator 11 formed previously. The material used for the insulator 32 is preferably the same as that used for the insulator 11 (e.g., 50 Å of $SiO_2$). However, as would be known by one ordinarily skilled in the art given this disclosure, the insulator 32 can be formed of a different material, depending upon the specific application being addressed.

A layer of another insulating material 30 (such as silicon nitride formed to a depth of 600 Å) is deposited over the structure. A selective etch (such as reactive ion etching RIE) is then applied to the structure to remove the majority of the insulator 30 leaving only the spacers 30, as shown in FIG. 3. The sidewall spacers 30 are formed by anisotropically etching back the insulating material. The anisotropic etching could be performed, for example, in a low pressure reactive ion etcher. Such etching etches the horizontal surfaces at a much higher rate (e.g., 50 times) than it etches the vertical surfaces, allowing the sidewall spacers 30 to remain after the etching process.

The selective etch is then continued (e.g., the structure is over-etched) to form a strap opening 33 down to a level such that the conductor 16 is exposed. For example, the structure can be overetched for distance of about 80 nm, as represented by item 31 in FIG. 3.

An important feature of the invention is that by forming strap opening 33 to have a different depth and width than the gate opening 20, a step 34 is created. Further, the strap opening 33 does not require lithographic formation techniques. Therefore, the strap opening 33 (and the positioning of the step 34) are self-aligned with the gate opening 20 and are not limited buy the size restrictions or alignment problems associated with lithographic techniques.

Figure 4:
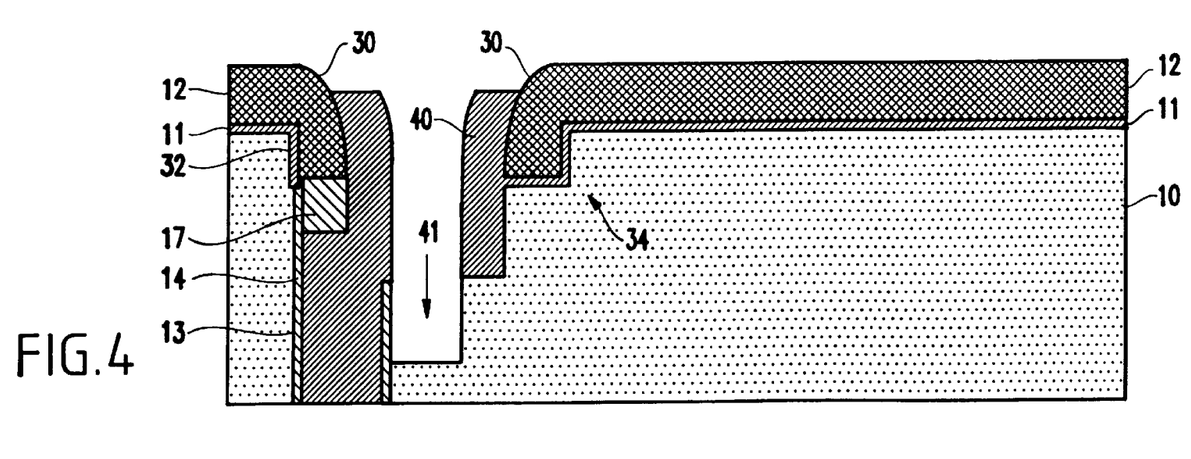
FIG. 4 is a schematic diagram of a partially completed vertical transistor according to the invention.

Next, as shown in FIG. 4, a conductive material 40, such as polysilicon, a metal or an alloy, is deposited in the strap opening 33. As with the process shown in FIG. 3, a selective etch is used to remove only a portion of the conductive material 40 to form conductive spacers 40. The structure is again overetched using an anisotropic selective etch to form a deeper first isolation portion opening 41 into the substrate 10. In a preferred embodiment the substrate 10 is recessed an additional 100 nm below the level of the conductive spacers 40.

The formation of the step 34, discussed above allows the conductor 40 (which will eventually become a conductive strap) to be positioned precisely along the area 31 of the strap opening 33. This precise placement allows the distance between the strap and a corresponding source/drain (which is formed later, as discussed below) to be precisely controlled without having to resort to lithographic techniques. This process increases the accuracy of positioning the conductive strap 40, which produces a higher manufacturing yield and allows the device to be reduced in size, making it faster and less expensive.

Figure 5:
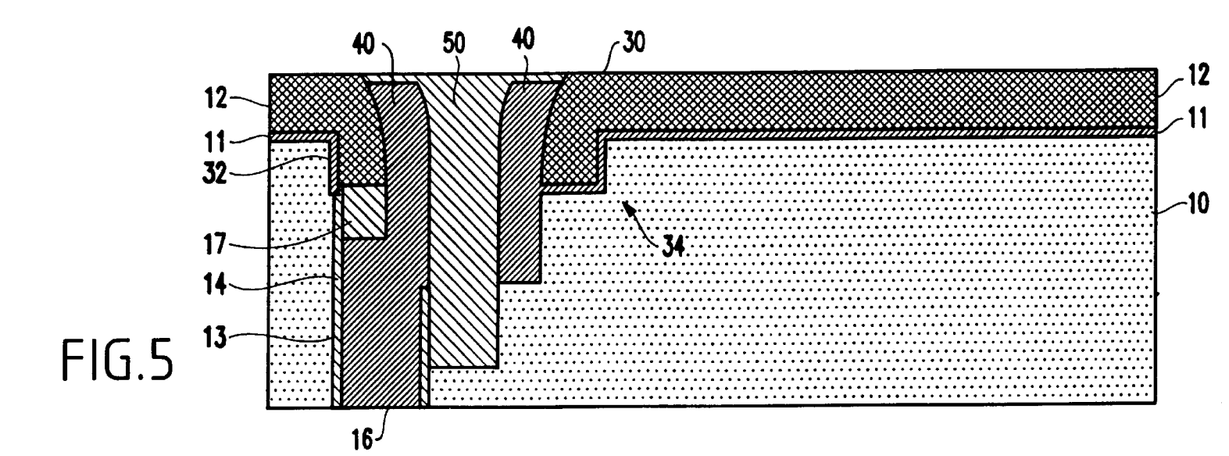
FIG. 5 is a schematic diagram of a partially completed vertical transistor according to the invention

Then, as shown in FIG. 5, an insulator 50 is formed within the first isolation portion opening 41 and the structure is planarized. The insulator 50 (in combination with additional insulators which are described below) separates active devices from one another and allows the active area definition mask (which is also discussed in detail below) to be dramatically simplified, which decreases defects, increases manufacturing yield and makes the device more reliable. Then, as shown in FIG. 6, the insulator materials 12 and 30 are removed in a selective etch such as a hot phosphoric acid etch.

Figure 6:
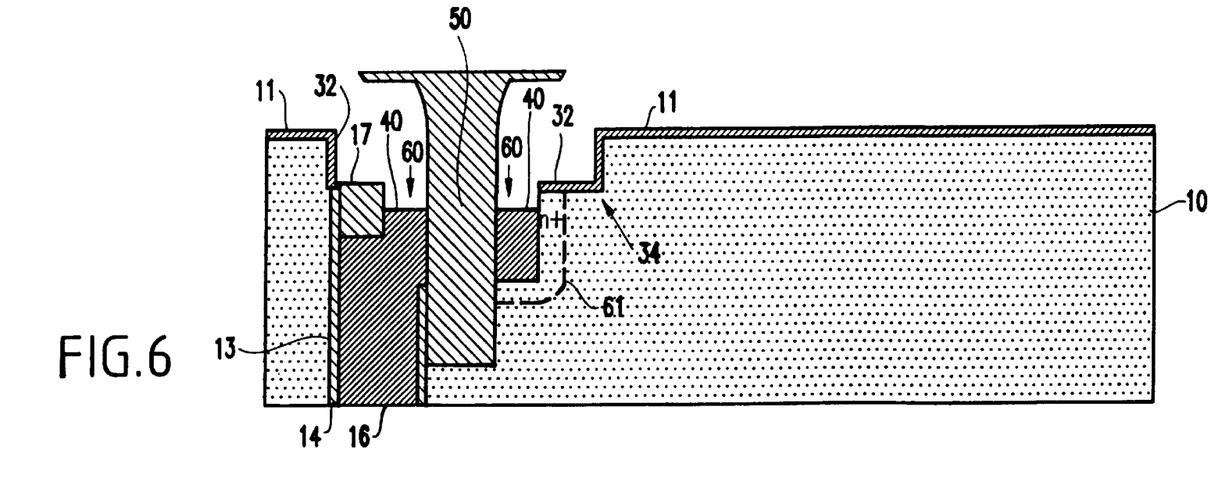
FIG. 6 is a schematic diagram of a partially completed vertical transistor according to the invention.

One ordinarily skilled in the art would realize, in light of this disclosure, that different materials can be used to form the structure shown in FIG. 6 and that, therefore, different selective etch solutions can be utilized to remove the insulators 12, 30 and still allow the insulator 11 to remain. In a preferred embodiment, the selective etch comprises an isotropic hot phosphoric acid. The etch process is also controlled to allow the unsupported insulator 50 to remain and to remove only a portion of the conductive spacers 40 (e.g., to remove approximately 300–600 Å of the conductive spacers 40), as shown in FIG. 6. A key feature of this etching process is that the conductive spacers 40 are recessed to form a divot 60 just below the level of the step 34.

A first diffusion region 61 is also formed at this time in the area of the substrate have adjacent to the strap 40. In a preferred embodiment the conductive material 40 includes an impurity (e.g., arsenic, phosphorous, etc.) which diffuses into the substrate from the strap 40 when the structure is heated (e.g. above 800° C.).

Figure 7:
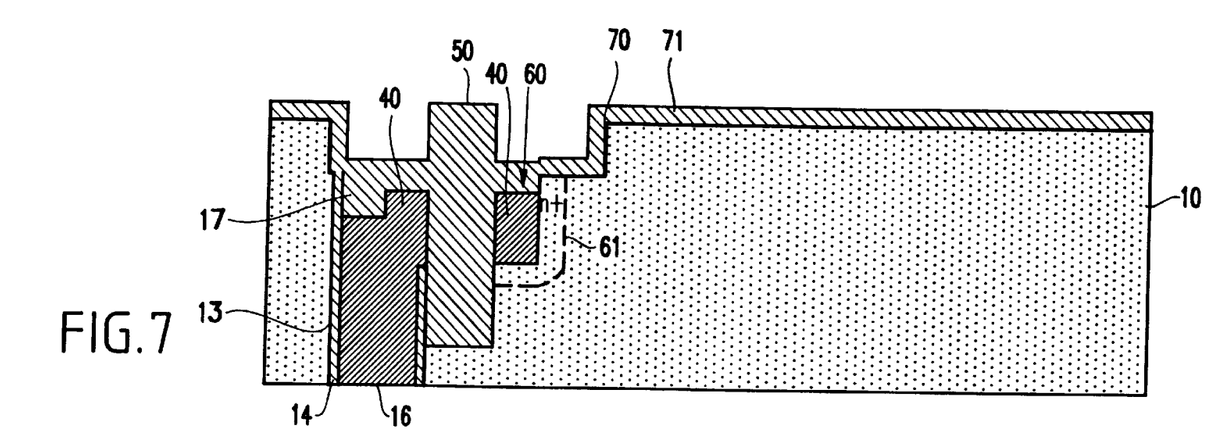
FIG. 7 is a schematic diagram of a partially completed vertical transistor according to the invention.

As shown in FIG. 7, the insulator layer 11, 32 is stripped using, for example, hydrofloric acid. Then, a sacrificial layer 70 (e.g., oxide, nitride, etc.) is formed (e.g., grown) on the exposed surfaces of the substrate. At this point, device implants can be performed using well-known processes and impurities.

Figure 8:
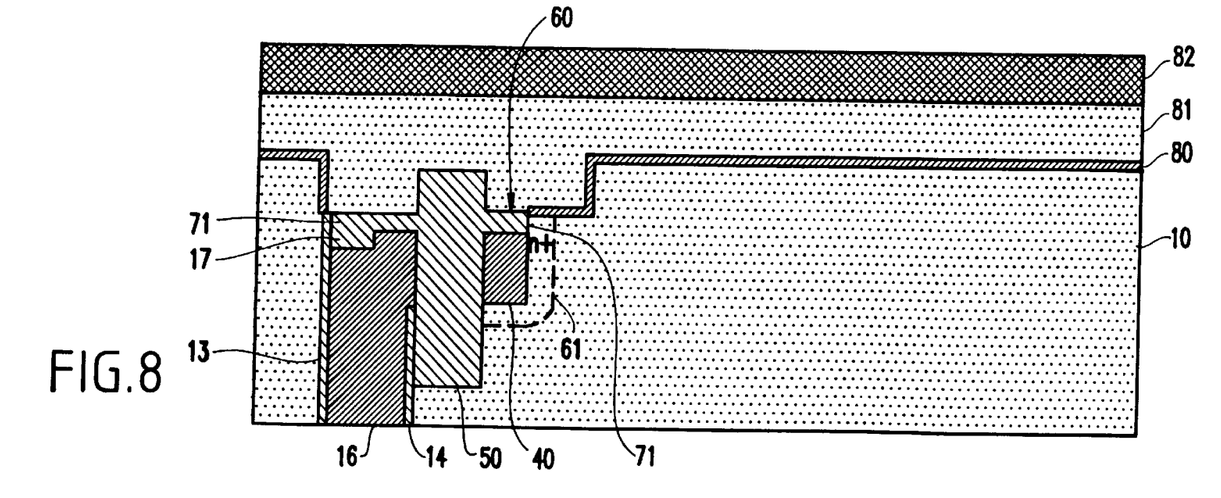
FIG. 8 is a schematic diagram of a partially completed vertical transistor according to the invention.

An insulator layer 71 (preferably comprising an oxide, nitride or oxynitride) is then deposited (to a preferred thickness of 300 angstroms). Then, as shown in FIG. 8, the sacrificial layer 70 and insulator 71 are removed using a wet etch (such as an HF, HF/glycerol etch solution). The wet etch dissolves in the sacrificial layer 70 which removes a portion of the insulator 71 above the sacrificial layer 70 and allows a portion of the insulator 71 to remain in the divot 60 to insulate the strap 40.

As also shown in FIG. 8, a gate insulator material 80, such as an oxide is formed over the expose substrate 10 surfaces using conventional formation techniques, such as oxide growth. Next, a conductive gate layer 81 is formed by depositing a conductive material such as polysilicon, metal or alloy. The gate conductor 81 is then planarized (again, using conventional techniques such as chemical mechanical polishing) and a pad insulator 82, such as a silicon nitride pad, is deposited and planarized using conventional, well known, techniques, such as those discussed above.

Figure 9A:
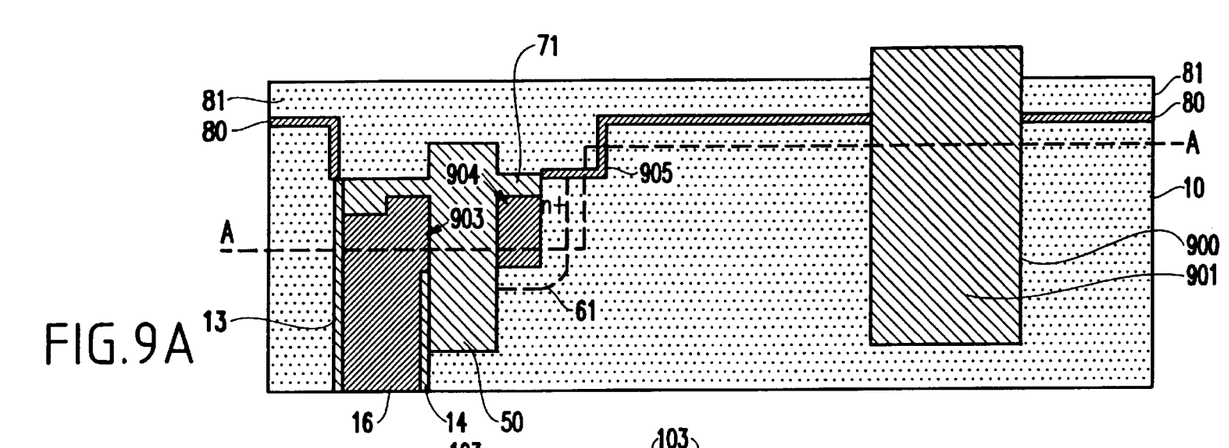
FIGS. 9A and 9B are cross-sectional and top views, respectively, of a schematic diagram of a partially completed vertical transistor according to the invention.
Figure 9B:
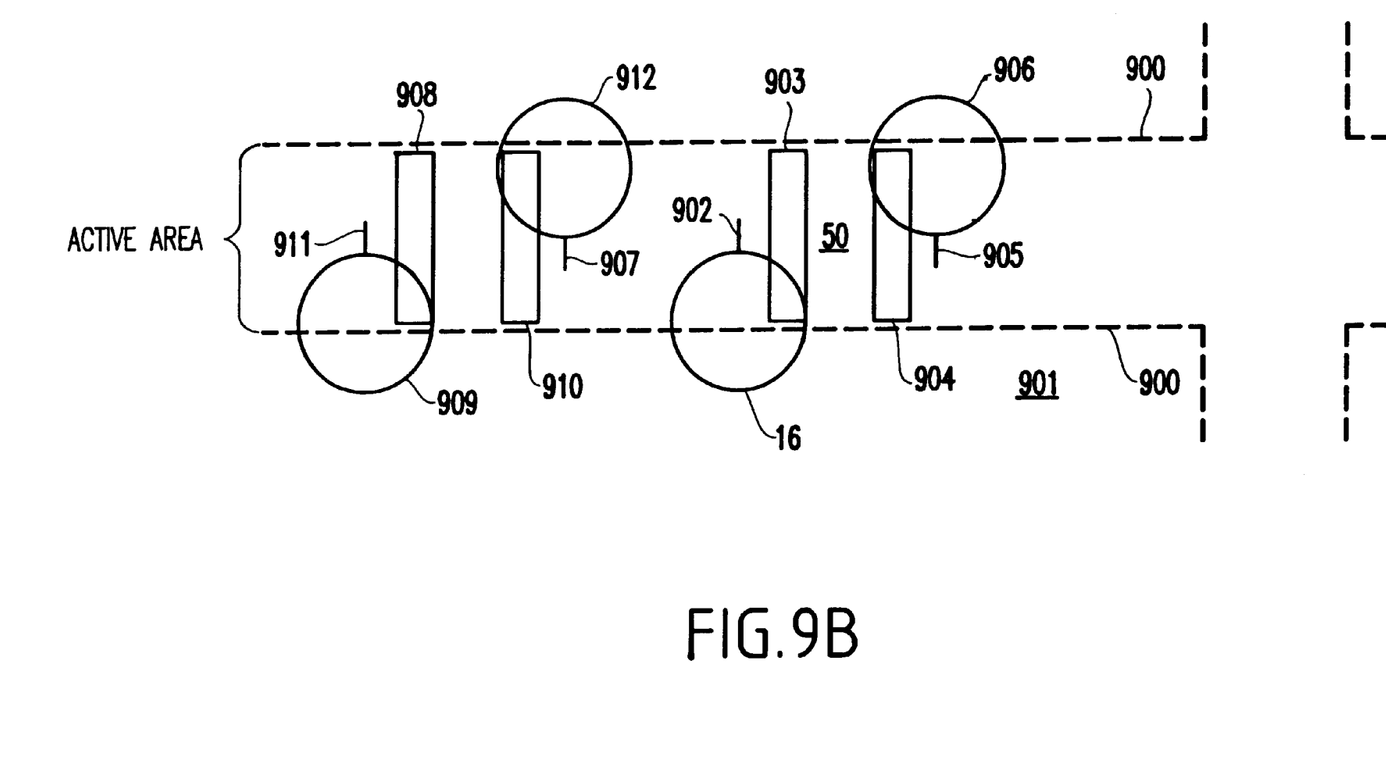

As shown in FIGS. 9A and 9B, the active area devices of the circuit are defined by forming an isolation region 901. FIG. 9B is a top view of the structure shown in FIG. 9A cut on line A—A.

More specifically, an active area definition mask is lithographically formed over the structure along lines 900 and the structure is etched to form the active area. The active area openings are filled with an insulator material 901. The insulator material 901 is preferably a high density plasma oxide (or tetraethylorthosilicate—TEOS). An important advantage produced by the invention is that the active area mask 900 is very simplified when compared to conventional active area masks because the first isolation portion opening 41 (and the insulator 50 therein) forms a first portion of the active area isolation region. Therefore, the second portion of the active area of isolation material 901 can be simple stripes formed along the structure, as shown in the top view in FIG. 9B.

The conductive straps 40 have been renumbered in FIG. 9A as straps 903, 904 to more clearly illustrates their position with respect to FIG. 9B. FIG. 9B illustrates the deep trench storage device 16, the isolation region 50 separating strap 903 from strap 904. Strap 904 is connected to another deep trench storage device 906 which is not visible in the cross section shown in FIG. 9A. In addition, the vertical transistor sidewall 905 is illustrated in FIGS. 9A and 9B. FIG. 9B also illustrates additional deep trench storage devices 909, 912 which are similar to deep trench storage device 16. FIG. 9B also illustrates additional vertical portions of a transistor 902, 907, 911 which are similar to the vertical portion of the transistor 905. Also illustrated in FIG. 9B is another isolation region 914 separating straps 908 and 910.

Another advantage of the invention, which is shown in FIG. 9B, is that the straps 903, 904, 908, 910 are formed along a plane bisecting each of the deep trench stores devices 16, 906, 909 and 912. In other words, the invented straps 903, 904, 908, 910 extend outwardly from the deep trench storage devices and are somewhat perpendicular to a vertical wall of the deep trench storage devices. To the contrary, conventional straps are generally formed along the outer periphery of the deep trench storage device and conform to the shape of the deep trench storage devices. The invention is superior to such conventional straps because having the inventive straps bisect a plane of the deep trench storage device provides a much more reliable connection between the strap and the deep trench storage device.

After forming the isolation region 901, the protective cap 82 is removed, using an etch which allows the isolation region 901 to extend above the conductor 81, thus creating a raised shallow trench isolation (RSTI) region.

Figure 10:
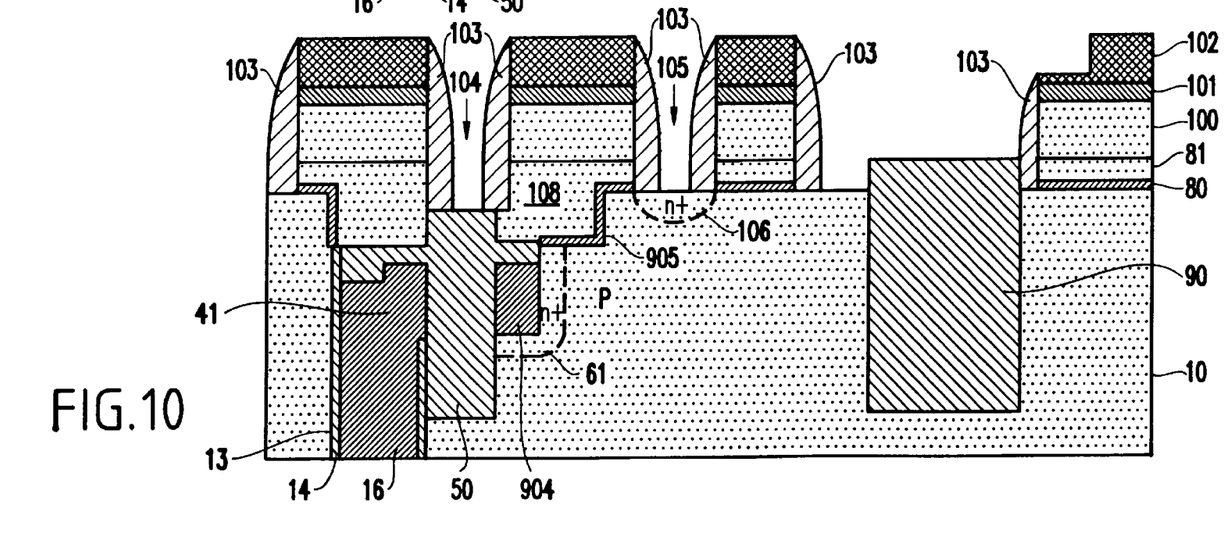
FIG. 10 is a schematic diagram of a completed vertical transistor according to the invention.

The remaining gate stack structure is then formed as shown in FIG. 10. More specifically, additional gate conductor material 100 is deposited over the previous gate conductor material 81. The second gate conductor material 100 may be the same or different material used for the previous gate conductor 81. Next a conductive layer such and as a silicide layer (e.g., a tungsten silicon $WSi_x$ layer) is formed to reduce the resistance of the gate conductor 81, 100. Lastly, a cap 102 layer is formed using conventional well known processes. For example, the cap 102 could comprise a silicon nitride pad material having a thickness of approximately 2000 Å.

The gate conductor stacks are then patterned using conventional lithographic and etching techniques to achieve the structure shown in FIG. 10. Insulating spacers 103 are then formed in the openings defined by the foregoing etching process. More specifically, an insulating material (such as silicon nitride, etc.) is deposited and isotropically etched to remove the spacer material 103 from all horizontal surfaces and to allow the spacer material 103 to remain on the vertical surfaces.

Either before or after the formation of the spacers 103, an impurity is deposited in the opening 105 to form a diffusion region 106. Depending upon the specific application of the circuit, it may be necessary to mask the openings which are not to be doped prior to implanting the impurity in the opening 105. The openings 104, 105 (as well as other selective openings) are then filled with a conductive material to form the various contact lines necessary for the circuit.

Figure 11:
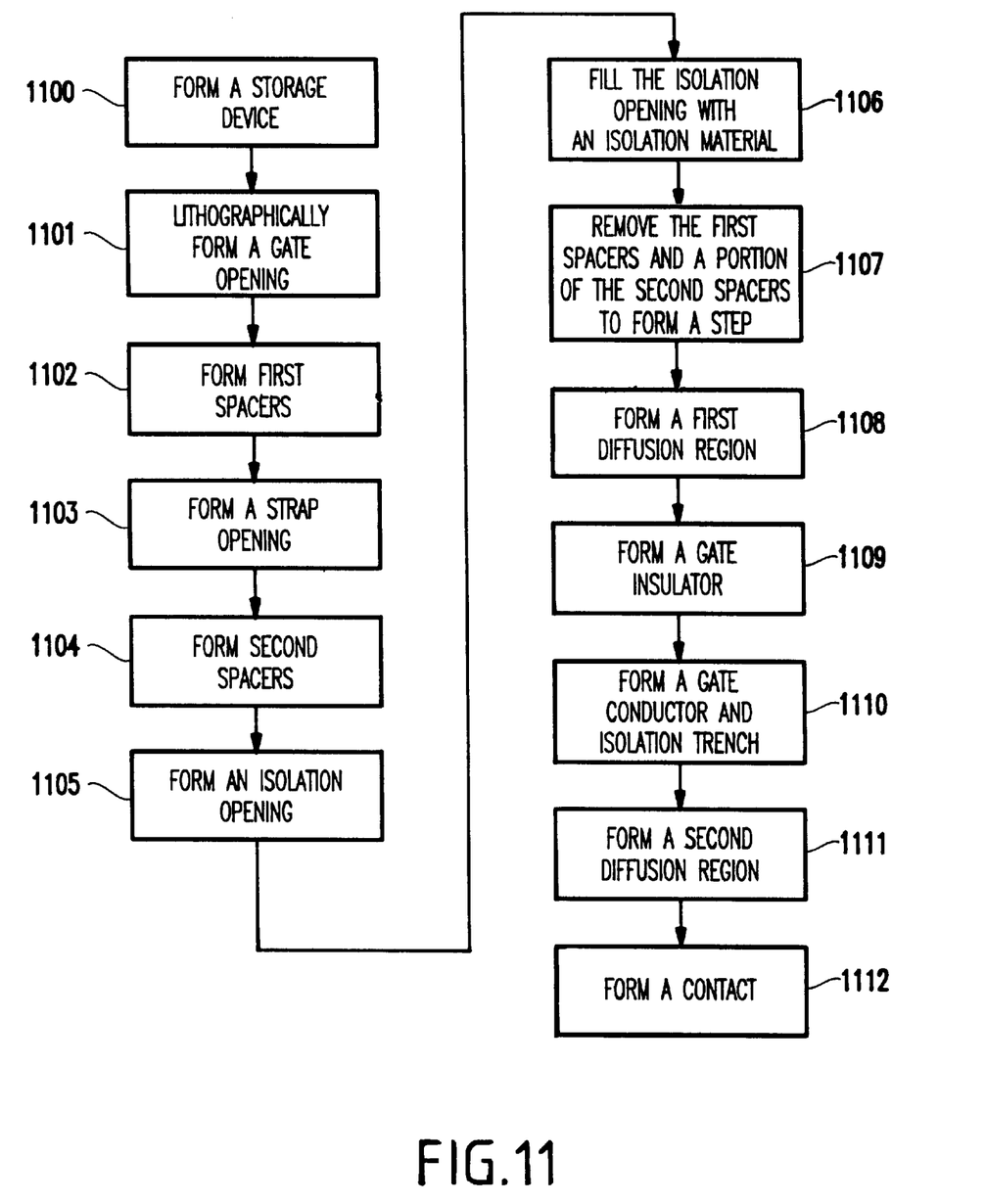
FIG. 11 is a flowchart illustrating a preferred embodiment of the invention.

FIG. 11 is a flowchart illustrating an embodiment of the invention. More specifically, in item 1100 the storage device 15 is formed. The gate opening 20 is lithographically formed in item 1101. In item 1102 the first spacers 30 are formed and the strap opening 33 is formed as shown in item 1103. In item 1104 the second spacers 40 are formed and the isolation opening 41 is formed as shown in item 1105. The isolation opening 41 is filled with the isolation material 50 as shown in item 1106. In item 1107 the first spacers 30 and a portion of the second spacers 40 are removed to form the step 34. A first diffusion region 61 is formed in item 1108 and the gate insulator 80 is formed as shown in item 1109. The gate conductor 108 and the isolation trench 104 are formed in item 1110 and the second diffusion region 106 is formed in item 1111. In item 1112 the contact 105 is formed.

In operation, when a voltage is applied to the gate conductor 108 the portion of the substrate 10 (e.g., a P-type substrate) along the vertical transistor portion 905 between the diffusion regions 106, 107 becomes conductive to make electrical contact between the conductor in opening 105 and the strap 904, which as shown in FIG. 9B is connected to storage device 906.

As shown above, the invention achieves many advantages by reducing the number of lithographic steps required to form a vertical (or partially vertical) transistor. More specifically, only a single opening 20 is formed by lithographic processes. The subsequent strap opening 33 and first isolation portions opening 41 are self-aligned using spacer technology and overetching.

By reducing the amount of lithographic processing, the invention avoids problems commonly associated with lithographic processes, including size reduction problems, alignment inaccuracies, etc. Further, with the invention by forming the step 34 in such a self-aligned manner, the spacing between the diffusion regions 61, 106 and the vertical transistor portion 905 is very precise. This allows the device to be made smaller (which makes the device less expensive and faster) and reduces the number of defects which results in an overall superior product when compared to conventional structures.

In addition, the invention forms the straps 903, 904, 908 and 910 to bisect a plane of the storage devices 16, 906, 909 and 912, which allows a more reliable connection between the storage device and the strap.

While the invention has been described in terms of preferred embodiments, those skilled in the art will recognize that the invention can be practiced with modification within the spirit and scope of the appended claims.

What is claimed is:

1. A method of manufacturing an integrated circuit chip comprising:
    forming an opening having at least one step in a substrate;
    forming a first conductor in said opening below said step;
    forming a first diffusion region in said substrate adjacent said first conductor and below said step;
    forming a gate conductor over said step and in said opening;
    forming a second conductor over said substrate adjacent said gate conductor; and
    forming a second diffusion region in said substrate adjacent said second conductor.

2. A method of manufacturing an integrated circuit chip comprising:
    forming an opening having at least one step in a substrate;
    forming a first conductor in said opening below said step;
    forming a first diffusion region in said substrate adjacent said first conductor and below said step;
    forming a gate conductor over said step;
    forming a second conductor over said substrate adjacent said gate conductor; and
    forming a second diffusion region in said substrate adjacent said second conductor, wherein said forming of said opening comprises:
        lithographically forming a gate opening in said substrate;
        forming first spacers in said gate opening;
        forming a strap opening in said substrate using said first spacers to align said strap opening;
        forming second spacers in said strap opening; and
        forming an isolation opening in said substrate using said second spacers to align said isolation opening.

3. The method in claim 2, further comprising filling said isolation opening with an isolation material, wherein said forming of said isolation opening in said substrate and said filling of said isolation opening with an isolation material comprises forming a first portion of an active area isolation region, said method further comprising forming active area stripes to form a second portion of said active area isolation region.

4. The method in claim 2, further comprising removing said first spacers and a portion of said second spacers to form said step in said opening, wherein said second spacers comprise said first conductor.

5. The method in claim 2, wherein said gate opening is wider than said strap opening and said strap opening is wider than said isolation opening.

6. The method in claim 1, wherein a voltage in said gate conductor forms a conductive region in said substrate adjacent said step, said conductive region electrically connecting said first conductor and said second conductor.

7. A method of manufacturing an integrated circuit chip comprising:
    forming an opening having at least one step in a substrate;
    forming a first conductor in said opening below said step;
    forming a first diffusion region in said substrate adjacent said first conductor and below said step;
    forming a gate conductor over said step;
    forming a second conductor over said substrate adjacent said gate conductor; and
    forming a second diffusion region in said substrate adjacent said second conductor,
    wherein said opening is formed over a deep trench capacitor, said first conductor bisecting a plane of said deep trench capacitor.

8. The method in claim 1, wherein said integrated circuit chip comprises a partially vertical transistor, said first conductor comprises a source region and said second conductor comprises a drain region.

9. A method of manufacturing an integrated circuit device comprising:
    forming a storage device in a substrate;
    lithographically forming a gate opening in said substrate over said storage device;
    forming first spacers in said gate opening;
    forming a strap opening in said substrate using said first spacers to align said strap opening;
    forming second spacers in said strap opening;
    forming an isolation opening in said substrate using said second spacers to align said isolation opening;
    filling said isolation opening with an isolation material;
    removing said first spacers and a portion of said second spacers to form a step in said gate opening, wherein said second spacers comprise at least one conductive strap electrically connected to said storage device;
    forming a first diffusion region in said substrate adjacent said conductive strap;
    forming a gate insulator layer over said substrate and said step;
    forming a gate conductor over a portion of said gate insulator layer above said step;

forming a second diffusion region in said substrate adjacent said gate conductor; and forming a contact over said second diffusion region and isolated from said gate conductor, wherein a voltage in said gate conductor forms a conductive region in said substrate adjacent said step, said conductive region electrically connecting said strap and said contact.

10. The method in claim 9, wherein said forming of said isolation opening in said substrate and said filling of said isolation opening with said isolation material comprises forming a first portion of an active area isolation region, said method further comprising forming active area stripes to form a second portion of said active area isolation region.

11. The method in claim 9, wherein said forming of said storage device comprises forming a deep trench capacitor, said strap bisecting a plane of said deep trench capacitor.

12. The method in claim 9, wherein said gate opening is wider than said strap opening and said strap opening is wider than said isolation opening.

13. The method in claim 9, wherein said integrated circuit device comprises a partially vertical transistor, said strap comprises a source region and said contact comprises a drain region.

14. A method as in claim 1, wherein said gate conductor is formed partially within said opening.

* * * * *